US012772675B2

(12) United States Patent
Kim et al.

(10) Patent No.: US 12,772,675 B2
(45) Date of Patent: Oct. 20, 2026

(54) DISPLAY PANEL AND DISPLAY DEVICE

(71) Applicant: LG Display Co., Ltd., Seoul (KR)

(72) Inventors: Ji Ah Kim, Paju-si (KR); Joung Mi Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 18/754,581

(22) Filed: Jun. 26, 2024

(65) Prior Publication Data

US 2025/0089478 A1 Mar. 13, 2025

(30) Foreign Application Priority Data

Sep. 7, 2023 (KR) ........................ 10-2023-0118956

(51) Int. Cl.
*H10K 59/124* (2023.01)
*G09G 3/3233* (2016.01)

(52) U.S. Cl.
CPC ......... *H10K 59/124* (2023.02); *G09G 3/3233* (2013.01); *G09G 2300/0819* (2013.01); *G09G 2300/0852* (2013.01); *G09G 2300/0861* (2013.01); *G09G 2310/08* (2013.01); *G09G 2320/0209* (2013.01); *G09G 2330/021* (2013.01)

(58) Field of Classification Search
None
See application file for complete search history.

(56) References Cited

U.S. PATENT DOCUMENTS

2014/0239270 A1* 8/2014 Ko ..................... H10K 59/1216 257/40
2022/0037447 A1* 2/2022 Cho ..................... G09G 3/3233
2022/0344448 A1* 10/2022 Zhang .................. H10K 59/873
2023/0016366 A1* 1/2023 Lee .................... H10K 59/1315

* cited by examiner

*Primary Examiner* — Andre L Matthews
(74) *Attorney, Agent, or Firm* — Morgan, Lewis & Bockius LLP

(57) ABSTRACT

A display panel may include a substrate, a first light emitting transistor and a driving transistor formed over the substrate, an interlayer insulating film formed to cover the first light emitting transistor and the driving transistor, a first planarization layer formed on the interlayer insulating film, a link line formed on the first planarization layer and electrically connected to the first light emitting transistor through the first planarization layer and the interlayer insulating film, a second planarization layer formed to cover the link line, and a light emitting element formed on the second planarization layer, in which a cathode electrode is electrically connected to the link line through a drilling area.

16 Claims, 12 Drawing Sheets

DISPLAY PANEL AND DISPLAY DEVICE

CROSS REFERENCE TO RELATED APPLICATION

This application claims the benefit of and priority to Korean Patent Application No. 10-2023-0118956, filed on Sep. 7, 2023, the entirety of which is incorporated herein by reference for all purposes as if fully set forth herein.

BACKGROUND

Technical Field

Embodiments of the present disclosure relate to display apparatuses, and particularly to, for example, without limitation, a display panel and a display device capable of stable operation.

Description of the Related Art

Representative display devices for displaying an image based on digital data include liquid crystal display (LCD) devices using liquid crystal and organic light emitting display devices using organic light emitting diodes (OLEDs).

Among these, the active matrix type organic light emitting display device uses organic light emitting diodes that emit light on their own, and has the advantages of fast response speed, high emission efficiency, high luminance, and wide viewing angle.

The organic light emitting display device includes a driving transistor (thin film transistor) to control the driving current flowing through the organic light emitting diode. It is desirable that the electrical characteristics of the driving transistor, such as threshold voltage and mobility, are designed to be the same in all subpixels, but in reality, the electrical characteristics of the driving transistor for each subpixel are variable depending on process conditions, driving environment, etc. For this reason, the driving current based on the same data voltage may vary for each subpixel, resulting in luminance deviation between subpixels.

To solve this problem, image quality compensation technology is used to reduce luminance deviation by sensing the electrical characteristics (threshold voltage, mobility) of the driving transistor from each subpixel and appropriately compensating the input data according to the sensing results.

An internal compensation method among image quality compensation technologies controls a driving timing of the subpixel to exclude a variation of the electrical characteristics of the driving transistor while the organic light emitting diode emits light. The internal compensation method basically may increase a gate voltage of the driving transistor using a source follower scheme to perform a sampling operation that saturates it to a certain level.

During the process of internal compensation, the gate electrode and source electrode of the driving transistor become floating state, and the gate-source voltage of the driving transistor may be changed due to parasitic capacitance other than the storage capacitor, which may cause defects such as crosstalk.

The description of the related art should not be assumed to be prior art merely because it is mentioned in or associated with this section. The description of the related art may include information that describes one or more aspects of the subject technology, and the description in this section does not limit the invention.

SUMMARY

The inventors of the present disclosure have recognized the problems and disadvantages of the related art and have performed extensive research and experiments. In this regard, the inventors of the present disclosure have invented a display panel and a display device that enable stable operation of the driving transistor during the internal compensation process.

One or more example embodiments of the present disclosure may provide a display panel and a display device that may stably maintain the source voltage of the driving transistor by connecting organic light emitting diodes with a common anode structure.

Additionally, one or more example embodiments of the present disclosure may provide a low-power display panel and a display device that may reduce power consumption through stable operation of the driving transistor.

According to one or more example embodiments, the present disclosure may provide a display panel comprising a substrate, a first light emitting transistor and a driving transistor formed over the substrate, an interlayer insulating film formed to cover the first light emitting transistor and the driving transistor, a first planarization layer formed on the interlayer insulating film, a link line formed on the first planarization layer and electrically connected to the first light emitting transistor through the first planarization layer and the interlayer insulating film, a second planarization layer formed to cover the link line, and a light emitting element formed on the second planarization layer, in which a cathode electrode is electrically connected to the link line through a drilling area.

According to one or more example embodiments, the present disclosure may provide a display device comprising a display panel including a plurality of subpixels, a gate driving circuit configured to supply a plurality of gate signals to the display panel through a plurality of gate lines, a data driving circuit configured to supply a plurality of data voltages to the display panel through a plurality of data lines, and a timing controller configured to control the gate driving circuit and the data driving circuit, wherein the display panel includes a substrate, a first light emitting transistor and a driving transistor formed over the substrate, an interlayer insulating film formed to cover the first light emitting transistor and the driving transistor, a first planarization layer formed on the interlayer insulating film, a link line formed on the first planarization layer and electrically connected to the first light emitting transistor through the first planarization layer and the interlayer insulating film, a second planarization layer formed to cover the link line, and a light emitting element formed on the second planarization layer, in which a cathode electrode is electrically connected to the link line through a drilling area.

According to one or more example embodiments of the disclosure, it is possible to stably operate the driving transistor during the internal compensation process.

According to one or more example embodiments of the disclosure, it is possible to stably maintain the source voltage of the driving transistor by connecting organic light emitting diodes with a common anode structure.

According to one or more example embodiments of the disclosure, it is possible to implement a low-power operation by reducing power consumption through stable operation of the driving transistor.

Other apparatuses, methods, features and advantages will be, or will become, apparent to one with skill in the art upon examination of the drawings and detailed description herein.

It is intended that all such apparatuses, methods, features and advantages be included within this description, be within the scope of the present disclosure, and be protected by the following claims. Nothing in this section should be taken as a limitation on the claims. Further aspects and advantages are discussed below in conjunction with embodiments of the disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure. In the drawings.

DETAILED DESCRIPTION

Figure 1:
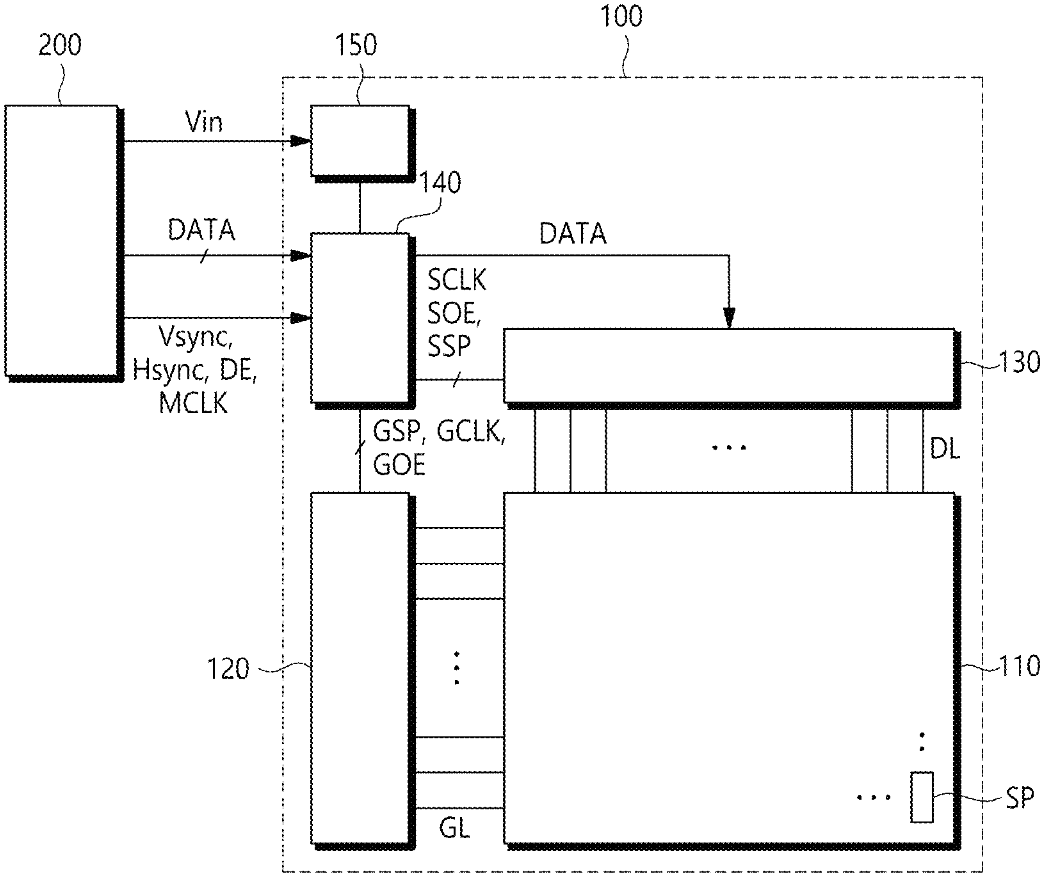
FIG. 1 is a view schematically illustrating a configuration of a display device according to one or more example embodiments of the present disclosure.

Hereinafter, some embodiments of the present disclosure will be described in detail with reference to example drawings. In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "comprising," "including", "having", "containing", "constituting", "made up of", "formed of," and the like used herein are generally intended to allow other components to be added unless the terms are used with the term "only". As used herein, singular forms are intended to include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various example embodiments of the present disclosure will be described in detail with reference to the accompanying drawings.

FIG. 1 is a view schematically illustrating a configuration of a display device according to one or more example embodiments of the present disclosure.

Referring to FIG. 1, a display device 100 according to one or more example embodiments of the disclosure may include a display panel 110 where a plurality of gate lines GL and data lines DL are connected, and a plurality of subpixels SP are arranged in a matrix form, a gate driving circuit 120 driving the plurality of gate lines GL, a data driving circuit 130 supplying a data voltage through the plurality of data lines DL, a timing controller 140 controlling the gate driving circuit 120 and the data driving circuit 130, and a power management circuit 150.

The display panel 110 displays an image based on a scan signal transferred from the gate driving circuit 120 through the plurality of gate line GLs GL and the data voltage transferred from the data driving circuit 130 through the plurality of data lines DL.

In the case of a liquid crystal display, the display panel 110 may include a liquid crystal layer formed between two substrates and may be operated in any known mode, such as a twisted nematic (TN) mode, a vertical alignment (VA) mode, an in-plane switching (IPS) mode, or a fringe field switching (FFS) mode. In the case of an organic light emitting display, the display panel 110 may be implemented in a top emission scheme, a bottom emission scheme, or a dual-emission scheme.

In the display panel 110, a plurality of pixels may be arranged in a matrix form, and each pixel may include subpixels SP having different colors, e.g., a white subpixel, a red subpixel, a green subpixel, and a blue subpixel, and each subpixel SP may be defined by the plurality of data lines DL and the plurality of gate lines GL.

One subpixel SP may include, e.g., a thin film transistor (TFT) formed at the intersection between one data line DL and one gate line GL, a light emitting element, such as an organic light emitting diode, charged with the data voltage, and a storage capacitor electrically connected to the light emitting element to maintain the voltage.

For example, when the display device 100 having a resolution of 2,160×3,840 includes four subpixels SP of white (W), red (R), green (G), and blue (B), 3,840 data lines DL may be connected to 2,160 gate lines GL and four subpixels WRGB, and thus, there may be provided 3,840×4=15,360 data lines DL. Each subpixel SP is disposed at the intersection between the gate line GL and the data line DL.

The gate driving circuit 120 may be controlled by the controller 140 to sequentially output scan signals to the plurality of gate lines GL disposed in the display panel 110, controlling the driving timing of the plurality of subpixels SP.

Depending on the case, the gate driving circuit 120 may output a scan signal that controls the driving timing of the subpixel SP and an emission signal that controls the emission timing of the subpixel SP. In this case, the gate signal output from the gate driving circuit 120 may include a scan signal and an emission signal. The circuit that outputs the scan signal and the circuit that outputs the light emission signal may be implemented as separate circuits or as one circuit.

In the display device 100 having a resolution of 2,160×3,840, sequentially outputting the scan signal to the 2,160 gate lines GL from the first gate line to the 2,160th gate line may be referred to as 2,160-phase driving. Sequentially outputting the scan signal to each unit of four gate lines GL, e.g., sequentially outputting the scan signal to the fifth gate line to the eighth gate line after sequentially outputting the scan signal to the first gate line to the fourth gate line, is referred to as 4-phase driving. In other words, sequentially outputting the scan signal to every N gate lines GL may be referred to as N-phase driving.

The gate driving circuit 120 may include one or more gate driving integrated circuits (GDICs). Depending on driving schemes, the gate driving circuit 120 may be positioned on only one side, or each of two opposite sides, of the display panel 110. The gate driving circuit 120 may be implemented in a gate-in-panel (GIP) form which is embedded in the bezel area of the display panel 110.

The data driving circuit 130 receives image data DATA from the timing controller 140 and converts the received image data DATA into an analog data voltage. Then, as the data voltage is output to each data line DL according to the timing when the scan signal is applied through the gate line GL, each subpixel SP connected to the data line DL displays a light emitting signal having the brightness corresponding to the data voltage.

Likewise, the data driving circuit 130 may include one or more source driving integrated circuits SDIC, and the source driving integrated circuit SDIC may be connected to the bonding pad of the display panel 110 in a tape automated bonding (TAB) type or a chip-on-glass (COG) type or may be disposed directly on the display panel 110.

In some cases, each source driving integrated circuit SDIC may be integrated and disposed on the display panel 110. Further, each source driving integrated circuit SDIC may be implemented in a chip-on-film (COF) type and, in this case, each source driving integrated circuit SDIC may be mounted on a circuit film and may be electrically connected to the data line DL of the display panel 110 through the circuit film.

The timing controller 140 supplies various control signals to the gate driving circuit 120 and the data driving circuit 130 and controls the operation of the gate driving circuit 120 and the data driving circuit 130. In other words, the timing controller 140 may control the gate driving circuit 120 to output a scan signal according to the timing implemented in each frame and, on the other hand, transfers the image data DATA received from the outside to the data driving circuit 130.

In this case, the timing controller 140 receives, from an external host system 200, several timing signals including, e.g., a vertical synchronization signal Vsync, a horizontal synchronization signal Hsync, a data enable signal DE, and a main clock MCLK, together with the image data DATA.

The host system 200 may be any one of a television (TV) system, a set-top box, a navigation system, a personal computer (PC), a home theater system, a mobile device, and a wearable device.

Accordingly, the timing controller 140 may generate a control signal according to various timing signals received from the host system 200 and transfers the control signal to the gate driving circuit 120 and the data driving circuit 130.

For example, the timing controller 140 outputs several gate control signals including, e.g., a gate start pulse GSP, a gate clock GCLK, and a gate output enable signal GOE, to control the gate driving circuit 120. The gate start pulse GSP controls the timing at which one or more gate driving integrated circuits GDIC constituting the gate driving circuit 120 start operation. The gate clock GCLK is a clock signal commonly input to one or more gate driving integrated circuits GDIC and controls the shift timing of the scan signal. The gate output enable signal GOE designates timing information about one or more gate driving integrated circuits GDICs.

The timing controller 140 outputs various data control signals including, e.g., a source start pulse SSP, a source sampling clock SCLK, and a source output enable signal SOE, to control the data driving circuit 130. The source start pulse SSP controls the timing at which one or more source driving integrated circuits SDIC constituting the data driving circuit 130 start data sampling. The source clock SCLK is a clock signal that controls the timing of sampling data in the source driving integrated circuit SDIC. The source output enable signal SOE controls the output timing of the data driving circuit 130.

The display device 100 may further include a power management circuit 150 that supplies various voltages or currents to, e.g., the display panel 110, the gate driving circuit 120, and the data driving circuit 130 or controls various voltages or currents to be supplied.

The power management circuit 150 adjusts the direct current (DC) input voltage Vin supplied from the host system 200, generating power required to drive the display panel 100, the gate driving circuit 120, and the data driving circuit 130.

The subpixel SP is positioned at the intersection between the gate line GL and the data line DL, and a light emitting element may be disposed in each subpixel SP. For example, the organic light emitting diode display may include a light emitting element, such as an organic light emitting diode, in each subpixel SP and may display an image by controlling the current flowing to the light emitting element according to the data voltage.

The display device 100 may be one of various types of devices, such as liquid crystal displays, organic light emitting diode displays, or plasma display panels.

Figure 2:
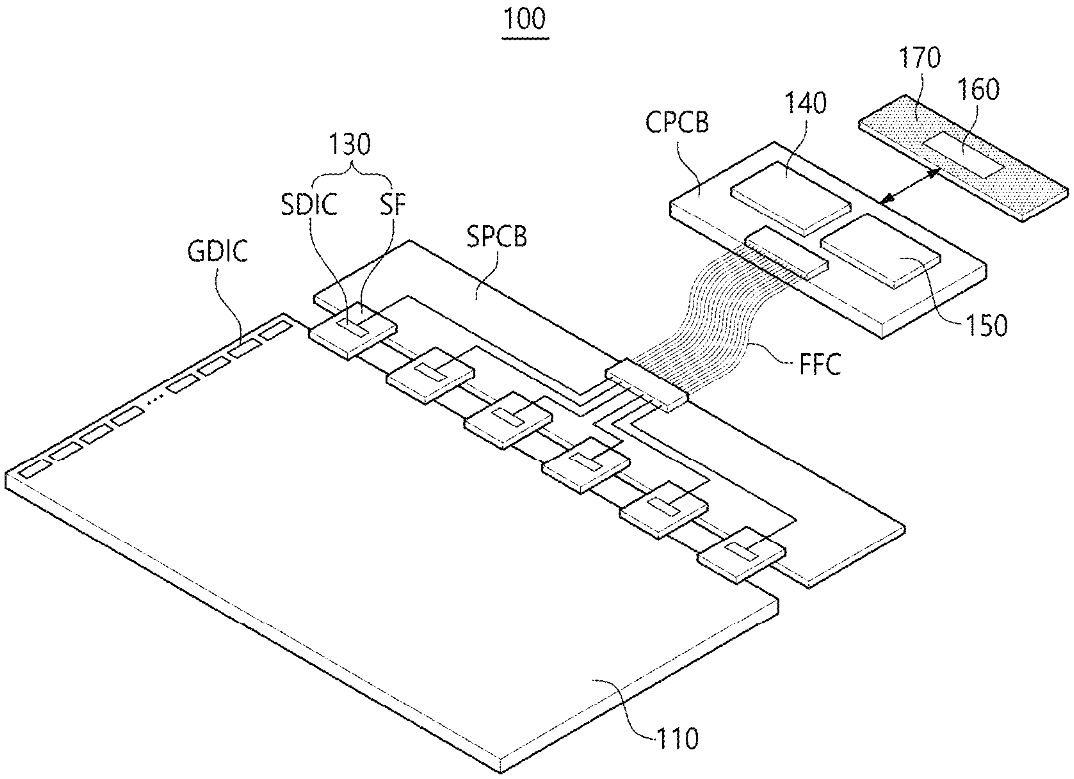
FIG. 2 is a diagram illustrating a system of the display device according to one or more example embodiments of the present disclosure.

FIG. 2 is a diagram illustrating a system of the display device according to one or more example embodiments of the present disclosure.

Referring to FIG. 2, the display device 100 according to one or more example embodiments of the present disclosure may include a plurality of source driving integrated circuit SDIC implemented using a COF structure from among a variety of structures such as TAB, COG, and COF structures in the data driving circuit 130, and the gate driving circuit 120 implemented using a GIP structure from among a variety of structures such as TAB, COG, COF, and GIP structures.

When the gate driving circuit 120 has the GIP structure, the plurality of gate driving integrated circuits GDIC of the gate driving circuit 120 may be directly formed in the bezel area of the display panel 110. Here, the gate driving integrated circuits GDIC may be provided with a variety of signals (e.g., a clock, a gate high signal, and a gate low signal) required for generation of scan signals through gate driving-related signal lines disposed in the bezel area.

In the same manner, the source driving integrated circuits SDIC of the data driving circuit 130 may be mounted on source films SF, respectively. One side of each of the source films SF may be electrically connected to the display panel 110. In addition, conductive lines electrically connecting the source driving integrated circuits SDIC to the display panel 110 may be disposed on the top portions of the source films SF.

The display device 100 may include at least one source printed circuit board SPCB and a control printed circuit board CPCB for circuit connection of the plurality of source driving integrated circuits SDIC to other devices. Here, control components and a variety of electrical devices may be mounted on the control printed circuit board CPCB.

Here, the other sides of the source films SF on which the source driving integrated circuits SDIC are mounted may be connected to the source printed circuit board SPCB. That is, each of the source films SF on which the source driving integrated circuits SDIC are mounted may be configured such that one side thereof is electrically connected to the display panel 110 and the other side thereof is electrically connected to the source printed circuit board SPCB.

The timing controller 140 and a power management circuit 150 may be mounted on the control printed circuit board CPCB. The timing controller 140 may control the operation of the data driving circuit 130 and the gate driving circuit 120. The power management circuit 150 may supply a driving voltage or current to the display panel 110, the data driving circuit 130, the gate driving circuit 120, and the like and may control the supplied voltage or current.

The source printed circuit board SPCB and the control printed circuit board CPCB may be circuit-connected to each other through at least one connecting member. The connecting member may be, for example, a flexible flat cable FFC, a flexible printed circuit (FPC), or the like. In addition, the source printed circuit board SPCB and the control printed circuit board CPCB may be integrated into a single printed circuit board (PCB).

The display device 100 may further include a set board 170 electrically connected to the control printed circuit board CPCB. Here, the set board 170 may also be referred to as a power board. The set board 170 may be provided with a main power management circuit 160 to manage the overall power of the display device 100. The main power management circuit 160 may work in concert with the power management circuit 150.

In the display device 100 having the above-described configuration, a driving voltage is generated by the set board 170 and is transferred to the power management circuit 150 in the control printed circuit board CPCB. The power management circuit 150 transfers the driving voltage, required for display driving or characteristic value sensing, to the source printed circuit board SPCB through the flexible printed circuit or the flexible flat cable FFC. The driving voltage transferred to the source printed circuit board SPCB is supplied through the driving integrated circuits SDIC in order to light or sense a specific subpixel SP in the display panel 110.

Here, each of the subpixels SP arrayed in the display panel 110 of the display device 100 may include a light-emitting element and circuit elements, such as a driving transistor, for driving the light-emitting element.

The type and number of the circuit elements provided in each of the subpixels SP may be determined variously depending on functions to be provided, designs, and the like.

Figure 3:
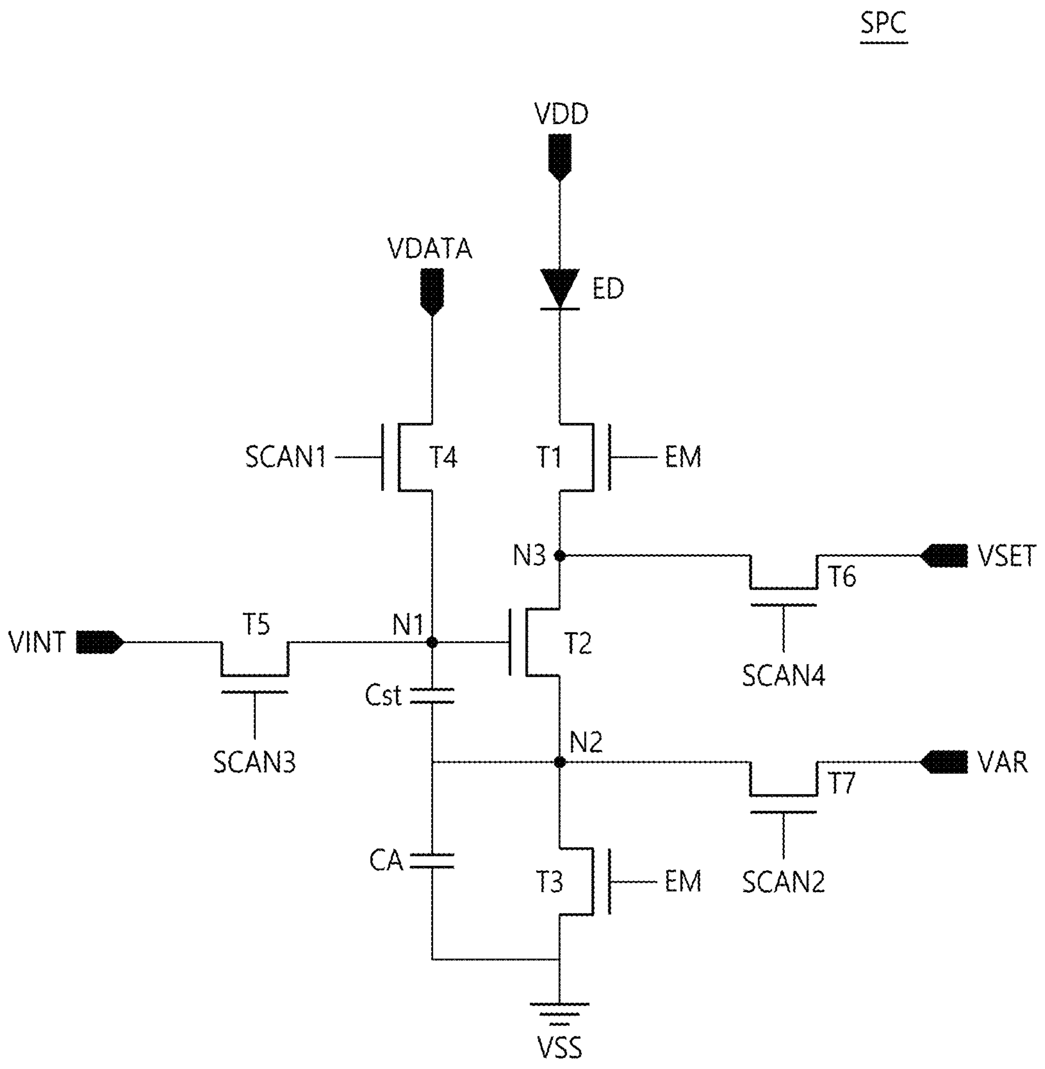
FIG. 3 is a diagram illustrating a subpixel circuit of a display device according to one or more example embodiments of the present disclosure.

FIG. 3 is a diagram illustrating a subpixel circuit of a display device according to one or more example embodiments of the present disclosure.

Referring to FIG. 3, the subpixel circuit SPC of the display device 100 according to one or more example embodiments of the present disclosure may include a light emitting element ED, a plurality of transistors T1-T7 and a plurality of capacitors Cst, CA for driving the light emitting element ED.

Here, a 7T2C subpixel SP consisting of seven transistors T1-T7 and two capacitors Cst, CA is shown as an example, but the circuit elements placed in the subpixel SP may be implemented in various ways depending on the type of the display device 100. In addition, it illustrates a case where the transistors T1-T7 disposed in the subpixel SP are N-type transistors, but in some cases, the subpixel SP may be composed of a P-type transistor.

When the subpixel SP is composed of P-type transistors, the scan signals SCAN1, SCAN2, SCAN3, SCAN4 may have the opposite polarity as when the subpixel SP is composed of N-type transistors.

When the subpixel SP is configured as 7T2C, each subpixel SP may include seven transistors T1-T7 and two capacitors Cst, CA.

The subpixel SP of the present disclosure may be configured so that a high-potential driving voltage VDD is commonly supplied to the anode electrode of the light emitting element ED for stable operation of the driving transistor.

The high-potential driving voltage VDD is supplied to the anode electrode of the light emitting element ED, and the cathode electrode of the light emitting element ED is electrically connected to a first transistor T1. For example, the light emitting element ED may be an organic light emitting diode OLED.

The first transistor T1 may be controlled by an emission signal EM, and may be electrically connected between the cathode electrode of the light emitting element ED and a second transistor T2. The first transistor T1 may also be called a light emitting transistor.

The second transistor T2 may have a first node N1, a second node N2, and a third node N3. The first node N1 may be a gate electrode and may be electrically connected to a fourth transistor T4 and a fifth transistor T5. The second node N2 may be a drain electrode or a source electrode, and may receive a low-potential base voltage VSS supplied through a third transistor T3. The third node N3 may be a source electrode or a drain electrode, and may be electrically connected to the cathode electrode of the light emitting element ED through the first transistor T1. This second transistor T2 may also be called a driving transistor.

The third transistor T3 may be controlled by the emission signal EM, and may be electrically connected between the second node N2 and the low-potential base voltage VSS. This third transistor T3 may also be called a light emitting transistor. Therefore, here, the first transistor T1 and the third transistor T3 may correspond to light emitting transistors.

The fourth transistor T4 may be controlled by a first scan signal SCAN1 and may be electrically connected between a line for supplying the data voltage VDATA and the first node N1 of the second transistor T2. This fourth transistor T4 may also be called a scan transistor.

The fifth transistor T5 may be controlled by a third scan signal SCAN3, and may be electrically connected between a node for supplying a gate initialization voltage VINIT and the first node N1 of the second transistor T2. This fifth transistor T5 may also be called an initialization transistor.

The sixth transistor T6 may be controlled by a fourth scan signal SCAN4, and may be electrically connected between a node for supplying a setting voltage VSET and the third node N3 of the second transistor T2. This sixth transistor T6 may also be referred to as a setting transistor. The fourth scan signal SCAN4 may be the same as the first scan signal SCAN1.

The seventh transistor T7 may be controlled by the second scan signal SCAN2, and may be electrically connected between a node for supplying a reset voltage VAR and the second node N2 of the second transistor T2. This seventh transistor T7 may also be called a reset transistor.

However, the second scan signal SCAN2 supplied to the seventh transistor T7 may be the same signal with a different phase from the fourth scan signal SCAN4 supplied to the sixth transistor T6. For example, when the fourth scan signal SCAN4 is supplied to the nth gate line, the second scan signal SCAN2 may use the fourth scan signal SCAN4 supplied to the (n−1)th gate line. That is, the second scan signal SCAN2 may use the fourth scan signal SCAN4 at different gate line GL depending on the phase at which the display panel 110 is driven.

A storage capacitor Cst may be electrically connected between the first node N1 and the second node N2 of the second transistor T2, and may maintain the data voltage VDATA for one frame.

An auxiliary capacitor CA may be connected between the second node N2 of the second transistor T2 and the low-potential base voltage VSS, and may have a function to maintain the voltage supplied to the second node N2. The auxiliary capacitor CA may be connected to the second node N2 and may increase the efficiency of the voltage supplied to the second node N2 of the second transistor T2 operating as a source follower.

The transistors T1-T7 composing of the subpixel SP may be P-type transistors or N-type transistors.

The P-type transistors are relatively more reliable than N-type transistors. In the case of a P-type transistor, the driving transistor T2 may be fixed to a high-potential driving voltage VDD in the period where the light emitting element ED emits light, so the current flowing through the light emitting element ED may be supplied stably without fluctuation.

When operating in the saturation period, the P-type transistor may pass a constant current regardless of changes in the threshold voltage, so it has a relatively high reliability.

On the other hand, because N-type transistors use electrons rather than holes as carriers, they have faster mobility than P-type transistors, which can increase switching speed.

The N-type transistor may be an oxide transistor formed using an oxide semiconductor (e.g., a transistor with a channel formed from an oxide semiconductor such as indium, gallium, zinc oxide, or IGZO). The P-type transistor may be a silicon transistor formed using a silicon semiconductor (e.g., a transistor with a poly-silicon channel formed using a low-temperature process referred to as LTPS or low-temperature poly-silicon).

In the display device 100 of the present disclosure, when the subpixel circuit SPC is configured so that the high-potential driving voltage VDD is commonly supplied to the anode electrode of the light emitting element ED, all of the transistors T1-T7 constituting the subpixel SP may be N-type transistors, or at least the second transistor T2 corresponding to the driving transistor may be an N-type transistor for stable operation.

Here, it illustrates the case where the transistors T1-T7 constituting the subpixel SP are N-type transistors.

Additionally, the terminology for the source electrode and drain electrode of a transistor may change depending on a polarity of the input voltage.

Figure 4:
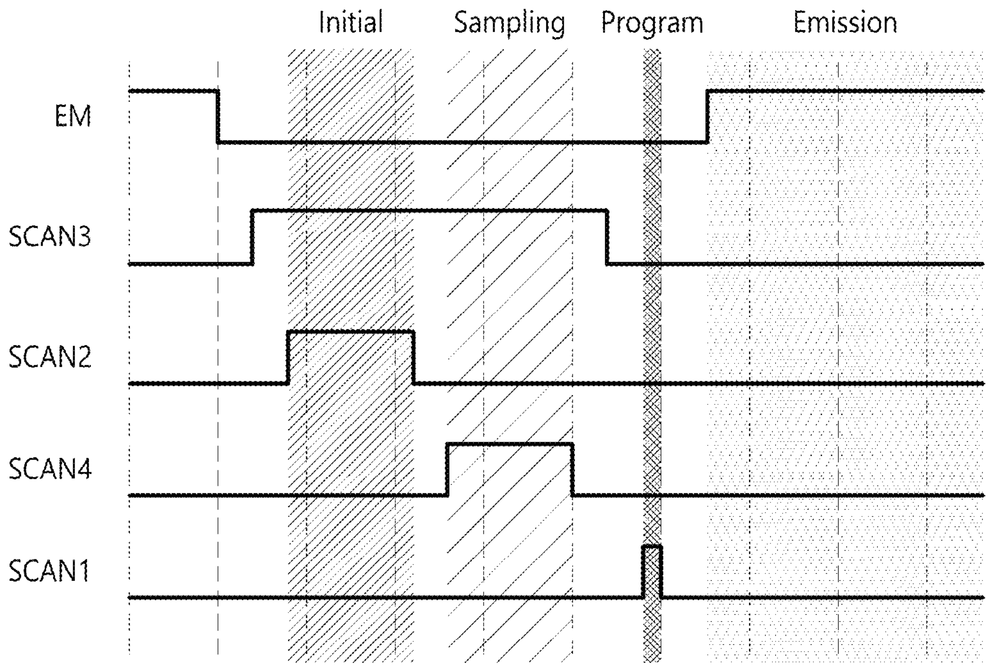
FIG. 4 is a diagram illustrating a driving timing of a subpixel according to one or more example embodiments of the present disclosure.
Figure 5:
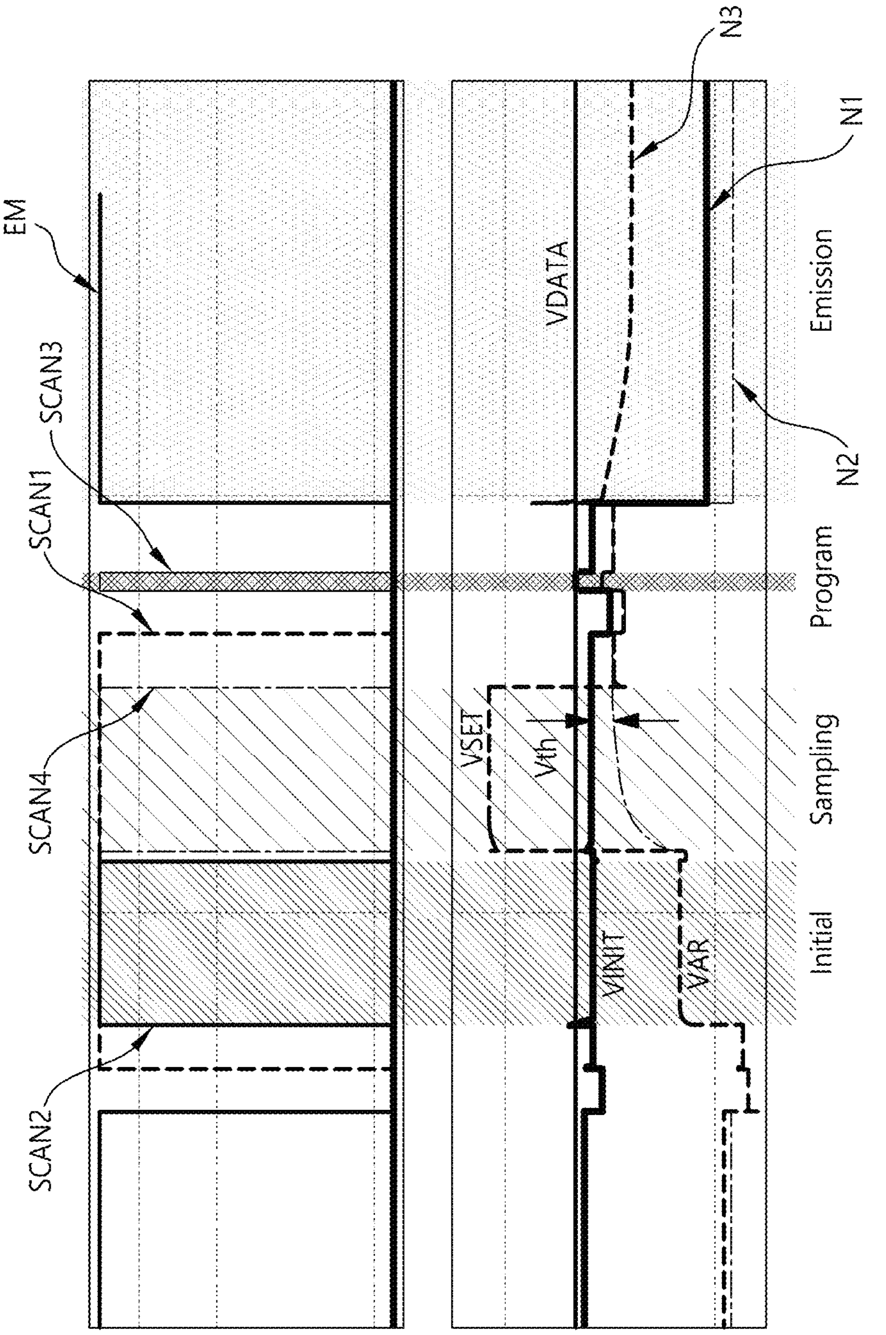
FIG. 5 is a diagram illustrating signal waveforms in nodes of a driving transistor depending on the driving timing of the subpixel according to one or more example embodiments of the present disclosure.

FIG. 4 is a diagram illustrating the driving timing of the subpixel according to one or more example embodiments of the present disclosure, and FIG. 5 is a diagram illustrating signal waveforms in nodes of the driving transistor depending on the driving timing of the subpixel according to the one or more example embodiments of the present disclosure.

Referring to FIGS. 4 and 5, subpixels according to one or more example embodiments of the present disclosure may operate with an initialization period Initial, a sampling period Sampling, a programming period Program, and an emission period Emission.

The initialization period Initial is a period in which the data voltage supplied to the light emitting element ED is reset by supplying the reset voltage VAR to the subpixel SP. The sampling period Sampling is a period in which the threshold voltage of the driving transistor T2 is stored in the capacitor connected to the driving transistor T2. The programming period Program is a period in which the data voltage VDATA is stored in the capacitor connected to the driving transistor T2 by supplying the data voltage VDATA to the subpixel SP.

Although the sampling period Sampling is distinct from the programming period Program, the sampling period Sampling and programming period Program may be operated sequentially or simultaneously depending on the subpixel structure. In the subpixel structure described in the example embodiment of the present disclosure, it illustrates the case where the sampling period Sampling and the programming period Program proceed sequentially.

The emission period Emission is a period in which the data voltage VDATA are not supplied through the data lines connected to each of the light emitting elements ED, and the data voltage VDATA stored in the capacitor is used to emit the light emitting elements ED.

During the initialization period Initial, the third scan signal SCAN3 and the second scan signal SCAN2 are supplied at a high level, so the fifth transistor T5 and the seventh transistor T7 are turned on.

Accordingly, the gate electrode of the second transistor T2 corresponding to the driving transistor may be initialized to the gate initialization voltage VINIT, and the second node N2 of the second transistor T2 may be reset to the reset voltage VAR.

During the initialization period Initial, the emission signal EM, the first scan signal SCAN1, and the fourth scan signal SCAN4 are supplied at a low level, so the first transistor T1, the third transistor T3, the fourth transistor T4 and the sixth transistor T6 are turned off.

Therefore, the gate initialization voltage VINIT and the reset voltage VAR may be supplied to both ends of the storage capacitor Cst, and the reset voltage VAR and low-potential base voltage VSS may be supplied to both ends of the auxiliary capacitor CA.

During the sampling period Sampling, the third scan signal SCAN3 is supplied at a high level, the second scan signal SCAN2 is supplied at a low level, and the fourth scan signal SCAN4 is applied at a high level.

Accordingly, the first node N1 of the second transistor T2 maintains the gate initialization voltage VINIT, and the third node N3 of the second transistor T2 receives the setting voltage VSET.

At this time, because the seventh transistor T7 is turned off, the second node N2 of the second transistor T2 may have a difference voltage (VINIT-Vth) corresponding to a difference between the gate initialization voltage VINIT and the threshold voltage Vth of the second transistor T2. Accordingly, the driving current flowing through the light emitting element ED by the second transistor T2 is not affected by the threshold voltage Vth. That is, compensation for the threshold voltage Vth of the second transistor T2 is accomplished.

In other words, during the sampling period Sampling, the subpixel performs a sampling operation to saturate the second transistor T2 to a certain level by increasing the gate voltage of the second transistor T2, which is a driving transistor, in a source follower manner.

During the programming period Program, the third scan signal SCAN3, the second scan signal SCAN2, and the fourth scan signal SCAN4 are supplied at a low level, and the first scan signal SCAN1 is supplied at a high level.

Accordingly, the data voltage VDATA supplied to the first node N1 of the second transistor T2 is charged to the storage capacitor Cst and the auxiliary capacitor CA.

In addition, the difference voltage (VINIT−Vth) between the gate initialization voltage VINIT and the threshold voltage Vth of the second transistor T2 is added to the charged voltage a*(VDATA−VINIT) at the storage capacitor Cst in the second node N2 of the second transistor T2. (Here, a=Cst/(Cst+CA))

During the emission period Emission, the first scan signal SCAN1 to the fourth scan signal SCAN4 are maintained at a low level, and the emission signal EM is supplied at a high level.

Accordingly, the corresponding subpixel SP emits light by the driving current flowing from the high-potential driving voltage VDD to the low-potential base voltage VSS through the light emitting element ED.

At this time, since a low-potential base voltage VSS is supplied to the second node N2 of the second transistor T2 corresponding to the driving transistor during the emission period Emission, the second transistor T2 may have a stable state. As a result, the gate-source voltage of the second transistor T2 can be prevented from changing due to parasitic capacitance, and image defects such as crosstalk may be reduced.

Meanwhile, the subpixel circuit of the present disclosure may achieve the same effect by supplying the same scan signal to some transistors. In this way, when the same scan signal is supplied to some transistors, the number of gate lines may be reduced and the structure of the gate driving circuit may be minimized, which has the effect of slimming the bezel area.

Figure 6:
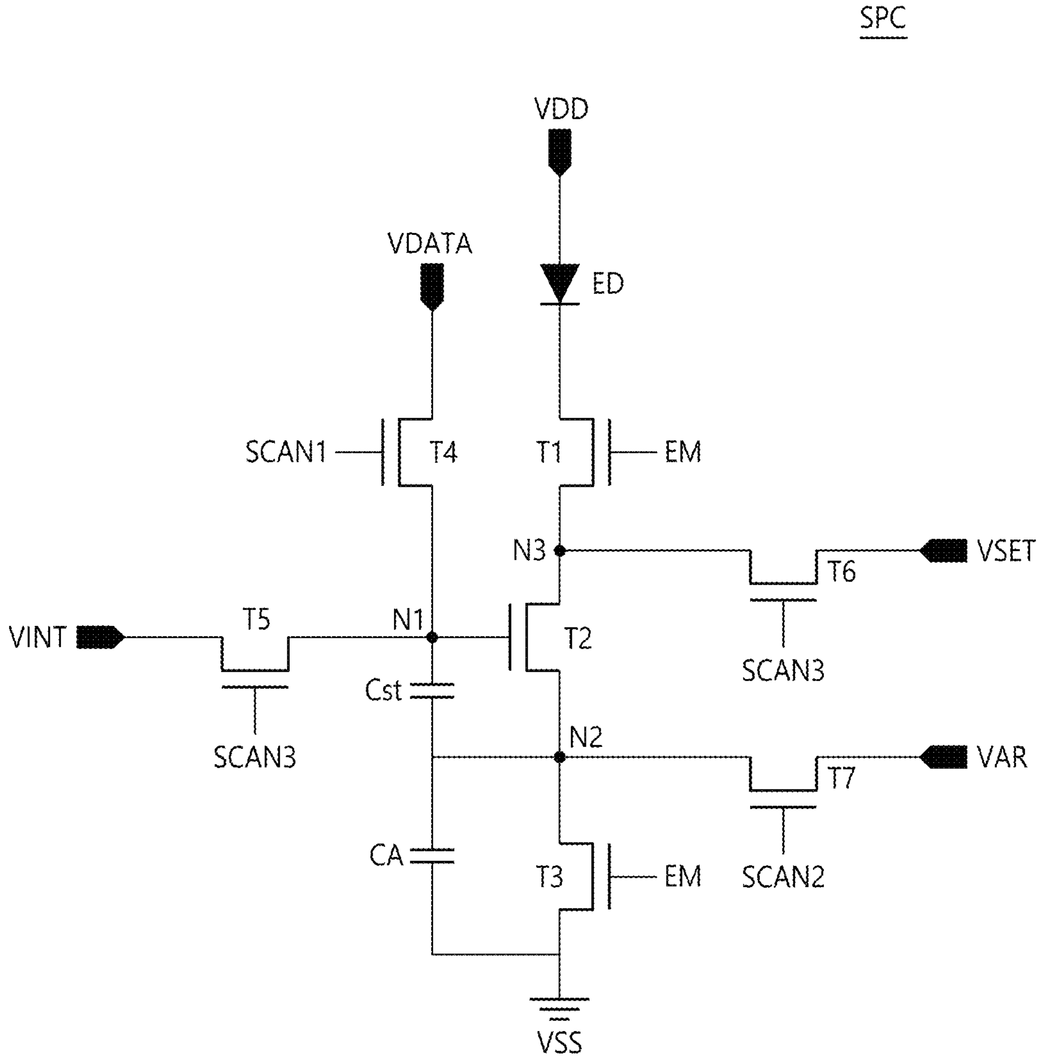
FIG. 6 is a diagram illustrating a subpixel circuit of a display device according to another example embodiment of the present disclosure.

FIG. 6 is a diagram illustrating a subpixel circuit of a display device according to another example embodiment of the present disclosure.

Referring to FIG. 6, the subpixel circuit SPC of the display device 100 according to one or more example embodiments of the present disclosure may include a light emitting element ED, a plurality of transistors T1-T7 for driving the light emitting element ED, and a plurality of capacitors Cst, CA.

The difference between the subpixel of FIG. 6 and the subpixel of FIG. 3 is that the fifth transistor T5 for supplying the gate initialization voltage VINIT to the first node N1 of the second transistor T2 corresponding to the driving transistor and the sixth transistor T6 for supplying the setting voltage VSET to the third node N3 of the second transistor T2 are controlled by the same first scan signal SCAN1.

The subpixel SP of the present disclosure may be configured for stable operation of the driving transistor so that a high-potential driving voltage VDD is commonly supplied to the anode electrode of the light emitting element ED.

The high-potential driving voltage VDD is supplied to the anode electrode of the light emitting element ED, and the cathode electrode of it is electrically connected to the first transistor T1.

The first transistor T1 may be controlled by an emission signal EM, and may be electrically connected between the cathode electrode of the light emitting element ED and a second transistor T2.

The second transistor T2 may have a first node N1, a second node N2, and a third node N3. The first node N1 may be a gate electrode and may be electrically connected to a fourth transistor T4 and a fifth transistor T5. The second node N2 may be a drain electrode or a source electrode, and may receive a low-potential base voltage VSS supplied through a third transistor T3. The third node N3 may be a source electrode or a drain electrode, and may be electrically connected to the cathode electrode of the light emitting element ED through the first transistor T1. This second transistor T2 may also be called a driving transistor.

The third transistor T3 may be controlled by the emission signal EM, and may be electrically connected between the second node N2 and the low-potential base voltage VSS.

The fourth transistor T4 may be controlled by a first scan signal SCAN1 and may be electrically connected between a line for supplying the data voltage VDATA and the first node N1 of the second transistor T2.

The fifth transistor T5 may be controlled by a third scan signal SCAN3, and may be electrically connected between a node for supplying a gate initialization voltage VINIT and the first node N1 of the second transistor T2.

The sixth transistor T6 may be controlled by a third scan signal SCAN3, and may be electrically connected between a node for supplying a setting voltage VSET and the third node N3 of the second transistor T2.

The seventh transistor T7 may be controlled by the second scan signal SCAN2, and may be electrically connected between a node for supplying a reset voltage VAR and the second node N2 of the second transistor T2.

However, the second scan signal SCAN2 supplied to the seventh transistor T7 may be the same signal with a different phase from the third scan signal SCAN3 supplied to the sixth transistor T6. For example, when the third scan signal SCAN3 is supplied to the nth gate line, the second scan signal SCAN2 may use the third scan signal SCAN3 supplied to the (n−1)th gate line. That is, the second scan signal SCAN2 may use the third scan signal SCAN3 at different gate line GL depending on the phase at which the display panel 110 is driven.

Therefore, the subpixel SP of the present disclosure may be controlled by the first to third scan signals SCAN1-SCAN3.

A storage capacitor Cst may be electrically connected between the first node N1 and the second node N2 of the second transistor T2, and may maintain the data voltage VDATA for one frame.

An auxiliary capacitor CA may be connected between the second node N2 of the second transistor T2 and the low-potential base voltage VSS, and may have a function to maintain the voltage supplied to the second node N2. The auxiliary capacitor CA may be connected to the second node N2 and may increase the efficiency of the voltage supplied to the second node N2 of the second transistor T2 operating as a source follower.

Here, it illustrates the case where the transistors T1-T7 constituting the subpixel are N-type transistors as an example.

Figure 7:
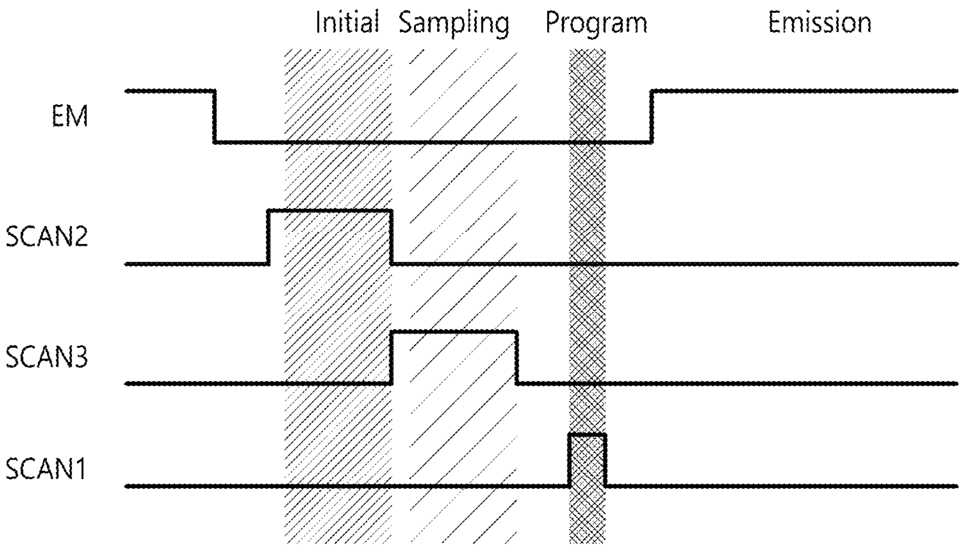
FIG. 7 is a diagram illustrating a driving timing of a subpixel according to another example embodiment of the present disclosure.
Figure 8:
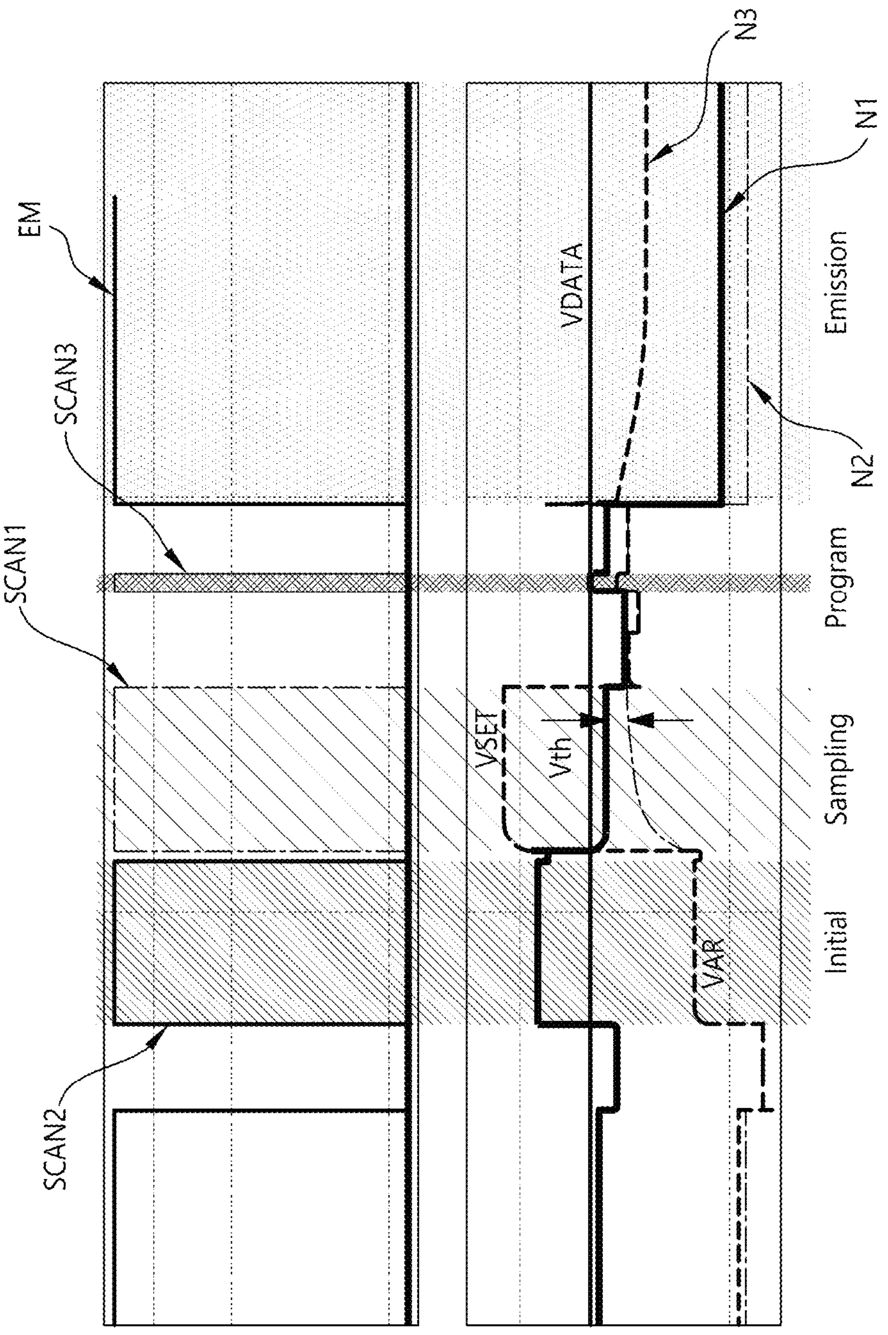
FIG. 8 is a diagram illustrating signal waveforms in nodes of a driving transistor depending on the driving timing of the subpixel according to another example embodiment of the present disclosure.

FIG. 7 is a diagram illustrating the driving timing of the subpixel according to another example embodiment of the present disclosure, and FIG. 8 is a diagram illustrating signal waveforms in nodes of the driving transistor depending on the driving timing of the subpixel according to another example embodiment of the present disclosure.

Referring to FIGS. 7 and 8, subpixels according to one or more example embodiments of the present disclosure may operate with an initialization period Initial, a sampling period Sampling, a programming period Program, and an emission period Emission.

The initialization period Initial is a period in which the data voltage supplied to the light emitting element ED is reset by supplying the reset voltage VAR to the subpixel SP. The sampling period Sampling is a period in which the threshold voltage of the driving transistor T2 is stored in the capacitor connected to the driving transistor T2. The programming period Program is a period in which the data voltage VDATA is stored in the capacitor connected to the driving transistor T2 by supplying the data voltage VDATA to the subpixel SP.

The emission period Emission is a period in which the data voltage VDATA are not supplied through the data lines connected to each of the light emitting elements ED, and the data voltage VDATA stored in the capacitor is used to emit the light emitting elements ED.

During the initialization period Initial, the second scan signal SCAN2 are supplied at a high level, so the seventh transistor T7 are turned on.

Accordingly, the second node N2 of the second transistor T2 corresponding to the driving transistor may be reset to the reset voltage VAR.

During the initialization period Initial, the emission signal EM, the first scan signal SCAN1, and the third scan signal SCAN3 are supplied at a low level, so the first transistor T1, the third transistor T3, the fourth transistor T4, the fifth transistor T5 and the sixth transistor T6 are turned off.

Therefore, the reset voltage VAR and low-potential base voltage VSS may be supplied to both ends of the auxiliary capacitor CA.

During the sampling period Sampling, the third scan signal SCAN3 is supplied at a high level, the second scan signal SCAN2 and the first scan signal SCAN1 are supplied at a low level.

Accordingly, the first node N1 of the second transistor T2 maintains the gate initialization voltage VINIT, and the third node N3 of the second transistor T2 receives the setting voltage VSET.

At this time, because the seventh transistor T7 is turned off, the second node N2 of the second transistor T2 may have a difference voltage (VINIT-Vth) corresponding to a difference between the gate initialization voltage VINIT and the threshold voltage Vth of the second transistor T2. Accordingly, the driving current flowing through the light emitting element ED by the second transistor T2 is not affected by the threshold voltage Vth. That is, compensation for the threshold voltage Vth of the second transistor T2 is accomplished.

In other words, during the sampling period Sampling, the subpixel performs a sampling operation to saturate the second transistor T2 to a certain level by increasing the gate voltage of the second transistor T2, which is a driving transistor, in a source follower manner.

During the programming period Program, the third scan signal SCAN3 and the second scan signal SCAN2 are supplied at a low level, and the first scan signal SCAN1 is supplied at a high level.

Accordingly, the data voltage VDATA supplied to the first node N1 of the second transistor T2 is charged to the storage capacitor Cst and the auxiliary capacitor CA.

In addition, the difference voltage (VINIT−Vth) between the gate initialization voltage VINIT and the threshold voltage Vth of the second transistor T2 is added to the charged voltage a*(VDATA−VINIT) at the storage capacitor Cst in the second node N2 of the second transistor T2. (Here, a=Cst/(Cst+CA))

During the emission period Emission, the first scan signal SCAN1 to the third scan signal SCAN3 are maintained at a low level, and the emission signal EM is supplied at a high level.

Accordingly, the corresponding subpixel SP emits light by the driving current flowing from the high-potential driving voltage VDD to the low-potential base voltage VSS through the light emitting element ED.

At this time, since a low-potential base voltage VSS is supplied to the second node N2 of the second transistor T2 corresponding to the driving transistor during the emission period Emission, the second transistor T2 may have a stable state. As a result, the gate-source voltage of the second transistor T2 can be prevented from changing due to parasitic capacitance, and image defects such as crosstalk may be reduced.

The subpixel SP illustrated here is only an example, and may be modified in various ways by including or removing one or more transistors, and including or removing one or more capacitors.

Figure 9:
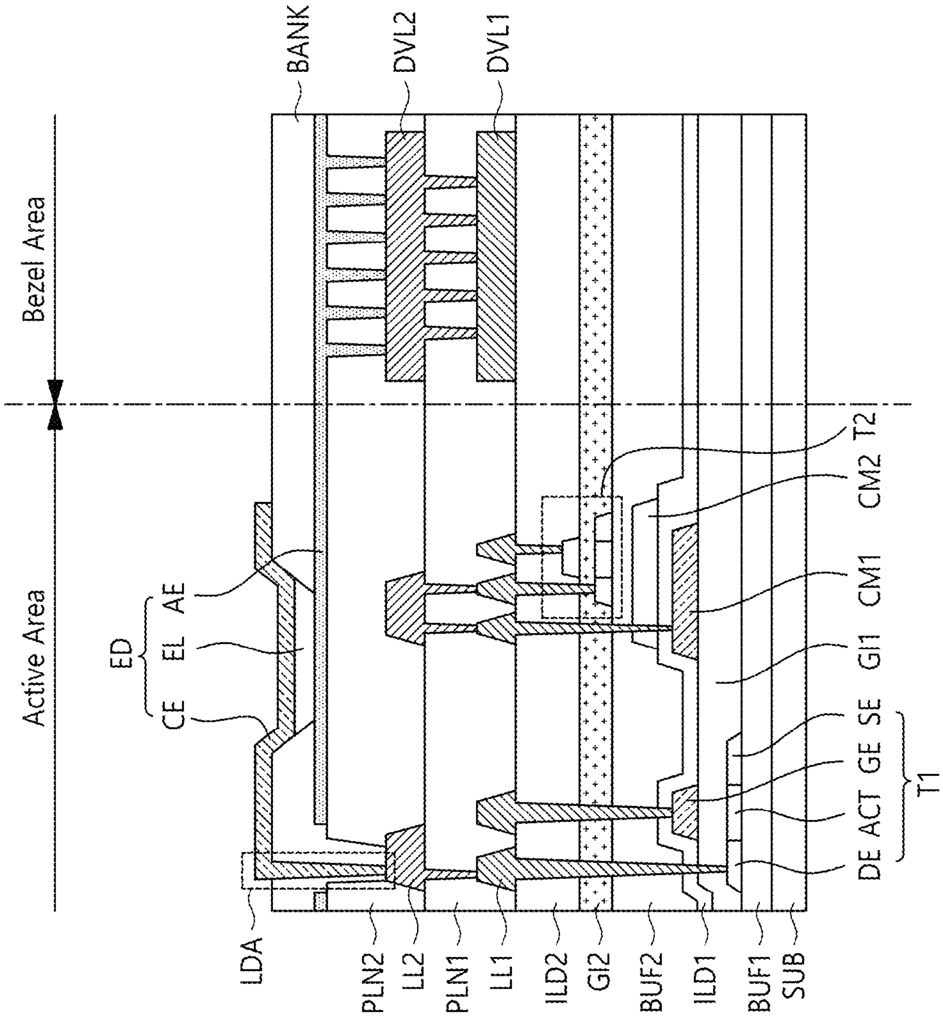
FIG. 9 is a diagram illustrating a cross-section of a display device according to one or more example embodiments of the present disclosure.
Figure 10:
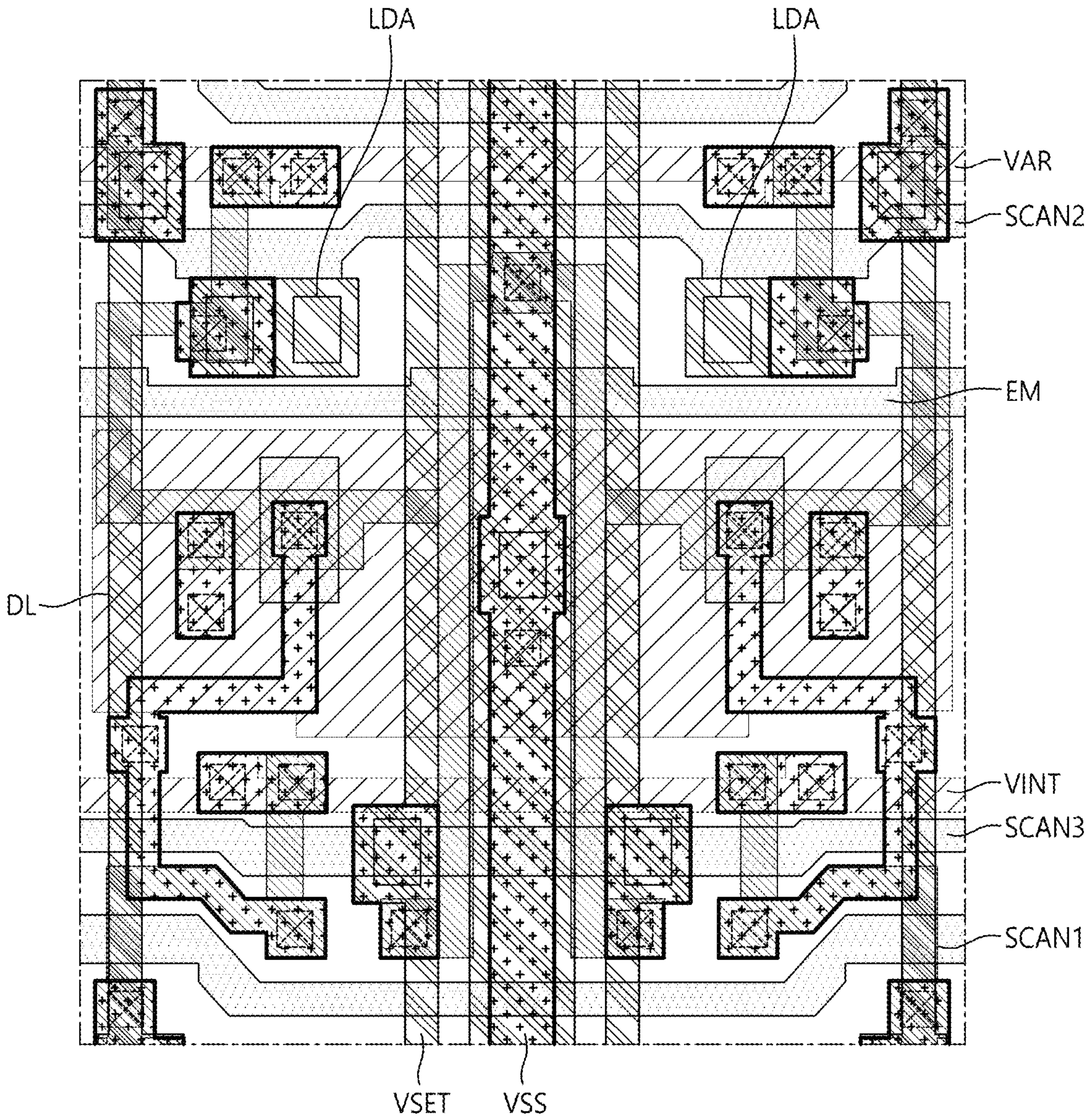
FIGS. 10 and 11 are diagrams illustrating top views of a display device according to one or more example embodiments of the present disclosure.
Figure 11:
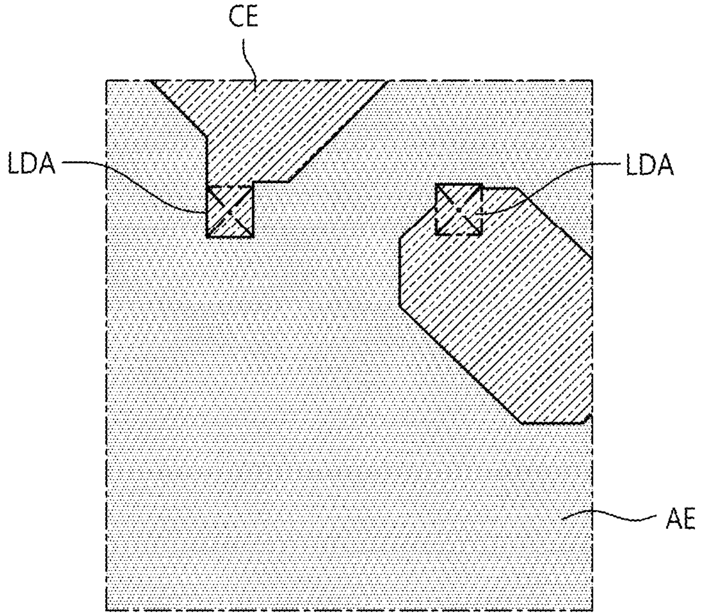

FIG. 9 is a diagram illustrating a cross-section of a display device according to one or more example embodiments of the present disclosure. FIGS. 10 and 11 are diagrams illustrating top views of a display device according to one or more example embodiments of the present disclosure.

Referring to FIGS. 9 to 11, the display panel 110 of the display device 100 according to one or more example embodiments of the present disclosure includes a substrate SUB.

A plurality of subpixels SP including a red subpixel, a green subpixel, and a blue subpixel are formed over the substrate SUB. Each of the plurality of subpixels SP may include a light emitting element ED including an anode electrode AE, an emission layer EL, and a cathode electrode CE, a plurality of transistors for driving the light emitting element ED, and capacitors.

A plurality of transistors, capacitors and light emitting elements ED may be formed over the substrate SUB.

The driving voltage line transmitting the high-potential driving voltage VDD may be electrically connected to the anode electrode AE of the light-emitting element ED, and the cathode electrode CE of the light-emitting element ED may be electrically connected to the drain electrode DE of the first transistor T1. The first transistor T1 may be a light emitting transistor.

An encapsulation layer may be formed on the cathode electrode CE of the light emitting element ED. The encapsulation layer may prevent oxygen or moisture from penetrating into the light emitting element ED.

A first buffer layer BUF1 may be disposed on the substrate SUB.

A first transistor T1 connected to the cathode electrode CE of the light emitting element ED may be formed on the first buffer layer BUF1.

A semiconductor layer ACT, a source electrode SE, and a drain electrode DE of the first transistor T1 may be formed on the first buffer layer BUF1.

A first gate insulating film GI1 may be disposed on the semiconductor layer ACT, the source electrode SE, and the drain electrode DE of the first transistor T1.

A first conductive electrode CM1 for transmitting an electrical signal to the gate electrode GE of the first transistor T1 may be disposed on the first gate insulating film GI1. For example, the first conductive electrode CM1 may be receive one of the setting voltage VSET, the reset voltage VAR, and the gate initialization voltage VINT and may be made of the same material as the gate electrode GE. For example, the first conductive electrode CM1 and the gate electrode GE may be made of molybdenum Mo.

A first interlayer insulating film ILD1 may be disposed on the gate electrode GE of the first transistor T1 and the first conductive electrode CM1.

The second conductive electrode CM2 may be formed on the first interlayer insulating film ILD1. For example, one of the setting voltage VSET, the reset voltage VAR, and the gate initialization voltage VINT may be supplied to the second conductive electrode CM2. Additionally, the second conductive electrode CM2 may serve as a shield electrode to block parasitic capacitance formed between the first conductive electrode CM1 and the upper transistor.

Additionally, a second buffer layer BUF2 may be disposed to cover the second conductive electrode CM2 and the first interlayer insulating film ILD1.

A second transistor T2 may be formed on the second buffer layer BUF2. The second transistor T2 may be a driving transistor, but may also be a transistor other than the driving transistor.

A semiconductor layer, a source electrode, and a drain electrode of the second transistor T2 may be disposed on the second buffer layer BUF2.

A second gate insulating film GI2 and a gate electrode of the second transistor T2 may be sequentially disposed on the semiconductor layer, the source electrode, and the drain electrode of the second transistor T2.

A second interlayer insulating film ILD2 may be disposed to cover the second transistor T2.

A first link line LL1 connecting the source electrode SE and the drain electrode DE of the first transistor T1 may be disposed on the second interlayer insulating film ILD2. The first link line LL1 may be located in the active area where the light emitting element ED is disposed.

Additionally, a first driving voltage line DVL1 for supplying a high-potential driving voltage VDD to the anode electrode AE of the light emitting element ED may be disposed on the second interlayer insulating film ILD2. The first driving voltage line DVL1 may be made of the same material as the first link line LL1.

Likewise, the first link line LL1 connecting the source electrode and the drain electrode of the second transistor T2 may be disposed on the second interlayer insulating film ILD2.

The source electrode SE and drain electrode DE of the first transistor T1 may be electrically connected to the first link line LL1 through a contact hole in the second interlayer insulating film ILD2.

A first planarization layer PLN1 may be disposed to cover the first link line LL1 on the second interlayer insulating film ILD2.

A second link line LL2 may be disposed on the first planarization layer PLN1 to connect the cathode electrode CE of the light emitting element ED to the first link line LL1. The second link line LL2 may be located in the active area where the light emitting elements ED are disposed.

Additionally, a second driving voltage line DVL2 for transmitting the high-potential driving voltage VDD to the anode electrode AE of the light emitting element ED may be disposed on the first planarization layer PLN1. The second driving voltage line DVL2 may be located in a bezel area where the light emitting elements ED are not disposed.

The second link line LL2 and the second driving voltage line DVL2 may be disposed on a different layer from the anode electrode AE, and may be made of the same material as the source electrode SE or the drain electrode DE of the first transistor T1.

Meanwhile, the first driving voltage line DVL1 and the second driving voltage line DVL2 may be formed in different layers. Alternatively, only one driving voltage line among the first driving voltage line DVL1 and the second driving voltage line DVL2 may be formed.

The second link line LL2 may be formed for electrical connection between the source electrode SE or the drain electrode DE of the first transistor T1 and the cathode electrode CE of the light emitting element ED.

The first link line LL1 and the second link line LL2 may be formed through different processes, but may also be formed as one link line through a single process.

A second planarization layer PLN2 may be disposed on the first planarization layer PLN1 to cover the second link line LL2 and the second driving voltage line DVL2.

The anode electrode AE may be disposed on the second planarization layer PLN2. The anode electrode AE for supplying the high-potential driving voltage VDD may extend to the bezel area and be connected to the second driving voltage line DVL2 through a contact hole in the bezel area.

At this time, some upper area overlapping the second link line LL2 may include an open area where the anode electrode AE and the second planarization layer PLN2 do not exist so that the cathode electrode CE may be connected to the second link line LL2.

Additionally, a bank BANK may be disposed on the anode electrode AE to define an emission area of the subpixel SP. A part of the bank BANK may be opened and a part of the anode electrode AE may be exposed. Therefore, the open area of the bank BANK may correspond to the emission area.

The emission layer EL may be disposed on the anode electrode AE exposed in the open area of the bank BANK, and the cathode electrode CE may be disposed on the emission layer EL.

Additionally, a drilling area LDA for exposing the second link line LL2 may be formed in the bank BANK. The drilling area LDA may be formed to expose the second link line LL2 by a laser drilling process.

Therefore, the cathode electrode CE may be connected to the second link line LL2 through the drilling area LDA by forming the cathode electrode CE on the bank BANK including the drilling area LDA. As a result, the cathode electrode CE of the light emitting element ED may be electrically connected to the drain electrode DE of the first transistor T1.

In this way, even if the anode electrode AE, the emission layer EL, and the cathode electrode CE are sequentially stacked, the cathode electrode CE may be electrically connected to the first transistor T1 through the drilling area LDA. In this case, even if the subpixel circuit SPC is configured so that the high-potential driving voltage VDD is commonly supplied to the anode electrode AE of the light emitting element ED, the display panel 110 may be easily manufactured without significantly changing the manufacturing process.

Figure 12:
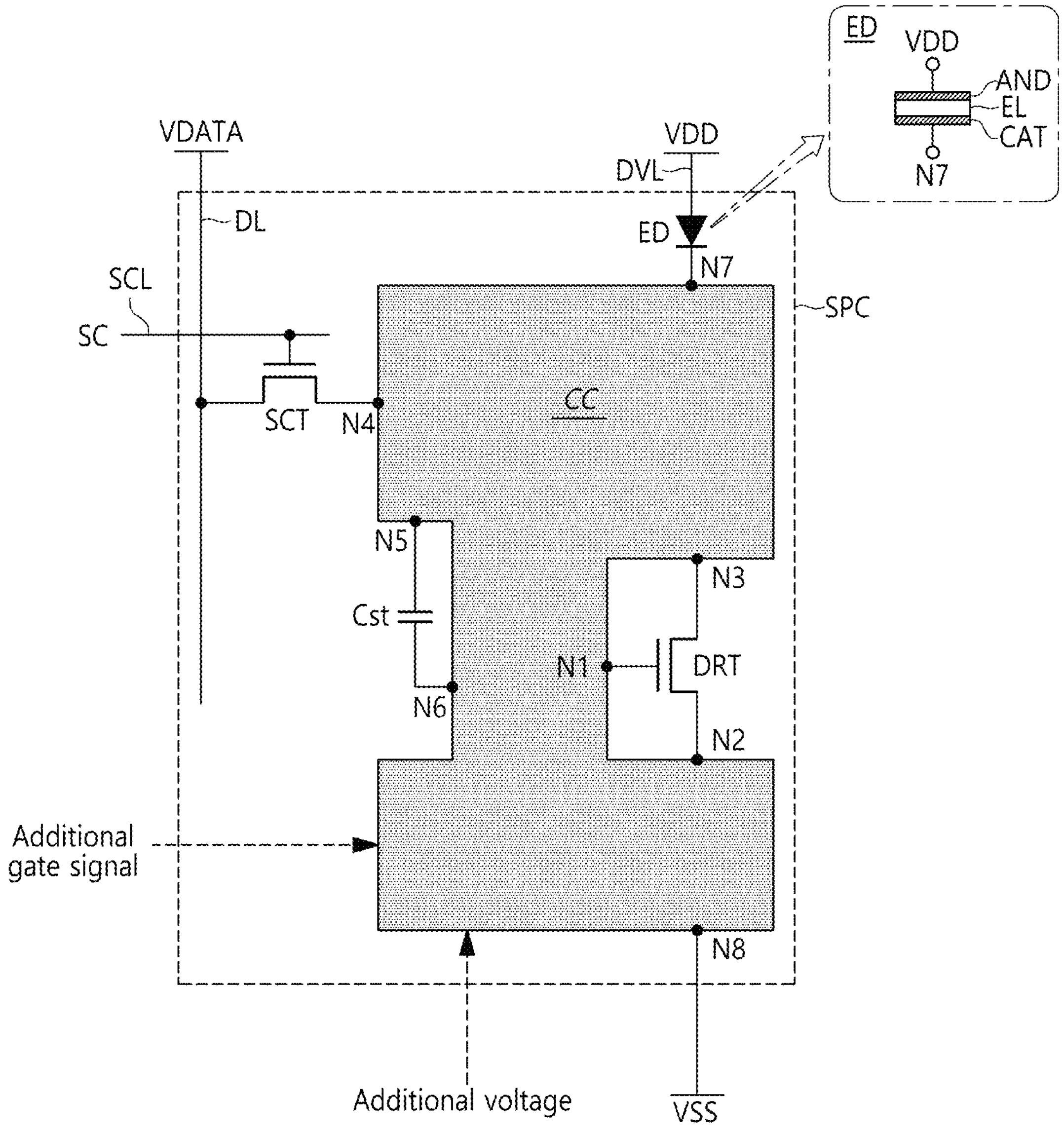
FIG. 12 illustrates a structure considering the possibility of deformation of a subpixel in a display device according to one or more example embodiments of the present disclosure.

FIG. 12 illustrates a structure considering the possibility of deformation of a subpixel in a display device according to one or more example embodiments of the present disclosure. However, descriptions of structures or components that are the same as those of the subpixel SP in FIG. 3 or FIG. 6 may be omitted.

Referring to FIG. 12, each of the plurality of subpixel circuits SPC disposed on the display panel 110 of the display device 100 according to one or more example embodiments of the disclosure may include a light emitting element ED and a plurality of circuit elements for driving the light emitting element ED.

Here, the light emitting element ED may be one of an organic light emitting diode (OLED), an inorganic light emitting diode (LED), and a quantum dot light emitting element.

The circuit elements constituting the subpixel circuit SPC may basically include a driving transistor DRT, a scan transistor SCT, and a storage capacitor Cst, and may further include a control circuit CC including one or more transistors and/or one or more capacitors.

The subpixel circuit SPC may be connected to a data line DL that supplies the data voltage VDATA and a scan signal line SCL that supplies the scan signal SCAN.

The subpixel circuit SPC may receive the high-potential driving voltage EVDD through the driving voltage line DVL, and receive a low-potential base voltage EVSS that is lower than the high-potential driving voltage EVDD.

The subpixel circuit SPC may further receive one or more additional voltages depending on the circuit configuration of the control circuit CC.

The subpixel circuit SPC may further receive one or more additional gate signals depending on the circuit configuration of the control circuit CC. For example, the additional gate signals may include scan signals and/or emission signals.

The driving transistor DRT is a transistor for driving the light emitting element ED, and may include a first node N1, a second node N2, and a third node N3. The first node N1 of the driving transistor DRT may be the gate electrode of the driving transistor DRT. The second node N2 of the driving transistor DRT may be a source electrode or drain electrode of the driving transistor DRT. The third node N3 of the driving transistor DRT may be the drain electrode or the source electrode of the driving transistor DRT, and have a high-potential driving voltage EVDD applied thereto.

The scan transistor SCT may be connected between the data line DL and the control circuit CC. The gate electrode of the scan transistor SCT may be electrically connected to the scan line SCL for supplying the scan signal SCAN, and the drain electrode or source electrode of the scan transistor SCT may be electrically connected to the data line DL.

The source electrode or drain electrode of the scan transistor SCT may be electrically connected to the fourth node N4 of the control circuit CC. For example, the fourth node N4 of the control circuit CC may be electrically connected to one of the first node N1, the second node N2, and the third node N3 of the driving transistor DRT or may be electrically connected to one of both ends of the storage capacitor Cst.

The both ends of the storage capacitor Cst may be connected to the fifth node N5 and sixth node N6, respectively, of the control circuit CC. One of the fifth node N5 and the sixth node N6 of the control circuit CC may be electrically connected to the first node N1 of the driving transistor DRT.

The driving voltage line DVL may be electrically connected to the seventh node N7 of the control circuit CC.

The light emitting element ED may be electrically connected to the eighth node N8 of the control circuit CC. The light emitting element ED may include an anode electrode AND, an emission layer EL, and a cathode electrode CAT. For example, the anode electrode AND may correspond to the pixel electrode and may receive the high-potential driving voltage VDD. The cathode electrode CAT may correspond to the common electrode and may be electrically connected to the seventh node N7 of the control circuit CC.

Each of the driving transistor DRT and the scan transistor SCT may be an N-type transistor or a P-type transistor. One or more transistors included in the control circuit CC may also be an N-type transistor or a P-type transistor.

Meanwhile, the subpixel circuit SPC may, or may not, include the control circuit CC. Although the subpixel circuit SPC includes the control circuit CC, the control circuit CC may have various circuit configurations. Here, the various circuit configurations may include the number and connection structure of the transistors and the number and connection structure of the capacitors.

For example, the presence or absence or the circuit configuration of the control circuit CC may be varied depending on, e.g., the size (e.g., large, medium, or small) of the display device 100, the type (e.g., television, monitor, smartphone/tablet) of the display device 100, driving scheme, or provided functions.

When the subpixel circuit SPC does not include the control circuit CC, the subpixel circuit SPC may have the most basic circuit configuration including a light emitting element ED, two transistors DRT, SCT and one capacitor Cst. In this case, the seventh node N7 and the third node N3 may be electrically connected, the fourth node N4, the fifth node N5, and the first node N1 may be electrically connected, and the sixth node N6, the eighth node N8, and the second node N2 may be electrically connected.

Various examples and aspects of the present disclosure are described below. These are provided as examples, and do not limit the scope of the present disclosure.

In one or more example embodiments, a display panel of the disclosure may comprise a substrate, a first light emitting transistor and a driving transistor formed over the substrate, an interlayer insulating film formed to cover the first light emitting transistor and the driving transistor, a first planarization layer formed on the interlayer insulating film, a link line formed on the first planarization layer and electrically connected to the first light emitting transistor through the first planarization layer and the interlayer insulating film, a second planarization layer formed to cover the link line, and a light emitting element formed on the second planarization layer, in which a cathode electrode is electrically connected to the link line through a drilling area.

In one or more examples, the interlayer insulating film includes a first interlayer insulating film covering the first light emitting transistor, and a second interlayer insulating film covering the driving transistor formed on the first interlayer insulating film.

In one or more examples, the display panel further comprises a first conductive electrode formed over the substrate, and a second conductive electrode formed on the first interlayer insulating film and located between the first conductive electrode and the driving transistor.

In one or more examples, the link line includes a first link line formed on the interlayer insulating film and electrically connected to the first light emitting transistor through the interlayer insulating film, and a second link line formed on the first planarization layer and electrically connected to the first link line through the first planarization layer.

In one or more examples, the light emitting element includes an anode electrode formed on the second planarization layer and extended to a bezel area, an emission layer formed in an open area of a bank on the anode electrode, and the cathode electrode formed to cover the emission layer.

In one or more examples, the display panel further comprises a driving voltage line electrically connected to the anode electrode in the bezel area.

In one or more examples, the driving voltage line includes a first driving voltage line formed on the interlayer insulating film, and a second driving voltage line formed on the first planarization layer and electrically connected to the first driving voltage line.

In one or more examples, the display panel further comprises a scan transistor controlled by a first scan signal and transmitting a data voltage through a data line, a storage capacitor, and a control circuit located between the cathode electrode of the light emitting element and a low-potential base voltage and controls operations of the driving transistor, the scan transistor, and the storage capacitor.

In one or more examples, the control circuit includes a second light-emitting transistor controlled by an emission signal and disposed between the driving transistor and the low-potential base voltage, a reset transistor controlled by a second scan signal and disposed between a node for supplying a reset voltage and the driving transistor, an initialization transistor controlled by a third scan signal and disposed between the driving transistor and a node for supplying a gate initialization voltage, a setting transistor controlled by a fourth scan signal and disposed between a node for supplying a setting voltage and the driving transistor, and an auxiliary capacitor connected between the driving transistor and a node for supplying the low-potential base voltage.

In one or more examples, the second scan signal is the same signal in different phases with the fourth scan signal.

In one or more example embodiments, a display device of the disclosure may comprise a display panel including a plurality of subpixels, a gate driving circuit configured to supply a plurality of gate signals to the display panel through a plurality of gate lines, a data driving circuit configured to supply a plurality of data voltages to the display panel through a plurality of data lines, and a timing controller configured to control the gate driving circuit and the data driving circuit, wherein the display panel includes a substrate, a first light emitting transistor and a driving transistor formed over the substrate, an interlayer insulating film formed to cover the first light emitting transistor and the driving transistor, a first planarization layer formed on the interlayer insulating film, a link line formed on the first planarization layer and electrically connected to the first light emitting transistor through the first planarization layer and the interlayer insulating film, a second planarization layer formed to cover the link line, and a light emitting element formed on the second planarization layer, in which a cathode electrode is electrically connected to the link line through a drilling area.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

What is claimed is:

1. A display panel, comprising:

a substrate;

a first light emitting transistor and a driving transistor formed over the substrate;

an interlayer insulating film formed to cover the first light emitting transistor and the driving transistor;

a first planarization layer formed on the interlayer insulating film;

a link line formed on the first planarization layer and electrically connected to the first light emitting transistor through the first planarization layer and the interlayer insulating film;

a second planarization layer formed to cover the link line; and a light emitting element including an anode electrode, an emission layer, and a cathode electrode sequentially stacked on the second planarization layer, in which the cathode electrode is electrically connected to the link line through a drilling area, wherein:

the anode electrode is formed on the second planarization layer and extended to a bezel area to electrically connect to a driving voltage line in the bezel area;

the emission layer is formed in an open area of a bank on the anode electrode; and the cathode electrode is formed to cover the emission layer.

2. The display panel according to claim 1, wherein the interlayer insulating film includes:

a first interlayer insulating film covering the first light emitting transistor; and a second interlayer insulating film covering the driving transistor formed on the first interlayer insulating film.

3. The display panel according to claim 2 further comprising:

a first conductive electrode formed over the substrate; and a second conductive electrode formed on the first interlayer insulating film and located between the first conductive electrode and the driving transistor.

4. The display panel according to claim 1, wherein the link line includes:

a first link line formed on the interlayer insulating film and electrically connected to the first light emitting transistor through the interlayer insulating film; and a second link line formed on the first planarization layer and electrically connected to the first link line through the first planarization layer.

5. The display panel according to claim 1, wherein the driving voltage line includes:

a first driving voltage line formed on the interlayer insulating film; and a second driving voltage line formed on the first planarization layer and electrically connected to the first driving voltage line.

6. The display panel according to claim 1 further comprising:

a scan transistor configured to be controlled by a first scan signal and configured to transmit a data voltage through a data line;

a storage capacitor; and a control circuit located between the cathode electrode of the light emitting element and a low-potential base voltage and configured to control operations of the driving transistor, the scan transistor, and the storage capacitor.

7. The display panel according to claim 6, wherein the control circuit includes:

a second light-emitting transistor configured to be controlled by an emission signal and disposed between the driving transistor and the low-potential base voltage;

a reset transistor configured to be controlled by a second scan signal and disposed between a node for supplying a reset voltage and the driving transistor;

an initialization transistor configured to be controlled by a third scan signal and disposed between the driving transistor and a node for supplying a gate initialization voltage;

a setting transistor configured to be controlled by a fourth scan signal and disposed between a node for supplying a setting voltage and the driving transistor; and an auxiliary capacitor connected between the driving transistor and a node for supplying the low-potential base voltage.

8. The display panel according to claim 7, wherein the second scan signal is a same signal in different phases with the fourth scan signal.

9. A display device, comprising:

a display panel including a plurality of subpixels;

a gate driving circuit configured to supply a plurality of gate signals to the display panel through a plurality of gate lines;

a data driving circuit configured to supply a plurality of data voltages to the display panel through a plurality of data lines; and a timing controller configured to control the gate driving circuit and the data driving circuit, wherein the display panel includes:

a substrate;

a first light emitting transistor and a driving transistor formed over the substrate;

an interlayer insulating film formed to cover the first light emitting transistor and the driving transistor;

a first planarization layer formed on the interlayer insulating film;

a link line formed on the first planarization layer and electrically connected to the first light emitting transistor through the first planarization layer and the interlayer insulating film;

a second planarization layer formed to cover the link line; and a light emitting element including an anode electrode, an emission layer, and a cathode electrode sequentially stacked on the second planarization layer, in which the cathode electrode is electrically connected to the link line through a drilling area, wherein:

the anode electrode is formed on the second planarization layer and extended to a bezel area to electrically connect to a driving voltage line in the bezel area;

the emission layer is formed in an open area of a bank on the anode electrode; and the cathode electrode is formed to cover the emission layer.

10. The display device according to claim 9, wherein the interlayer insulating film includes:

a first interlayer insulating film covering the first light emitting transistor; and a second interlayer insulating film covering the driving transistor formed on the first interlayer insulating film.

11. The display device according to claim 10 further comprising:

a first conductive electrode formed over the substrate; and a second conductive electrode formed on the first interlayer insulating film and located between the first conductive electrode and the driving transistor.

12. The display device according to claim 9, wherein the link line includes:

a first link line formed on the interlayer insulating film and electrically connected to the first light emitting transistor through the interlayer insulating film; and a second link line formed on the first planarization layer and electrically connected to the first link line through the first planarization layer.

13. The display device according to claim 9, wherein the driving voltage line includes:

a first driving voltage line formed on the interlayer insulating film; and a second driving voltage line formed on the first planarization layer and electrically connected to the first driving voltage line.

14. The display device according to claim 9 further comprising:

a scan transistor configured to be controlled by a first scan signal and configured to transmit a data voltage through a data line;

a storage capacitor; and a control circuit located between the cathode electrode of the light emitting element and a low-potential base voltage and configured to control operations of the driving transistor, the scan transistor, and the storage capacitor.

15. The display device according to claim 14, wherein the control circuit includes:

a second light-emitting transistor configured to be controlled by an emission signal and disposed between the driving transistor and the low-potential base voltage;

a reset transistor configured to be controlled by a second scan signal and disposed between a node for supplying a reset voltage and the driving transistor;

an initialization transistor configured to be controlled by a third scan signal and disposed between the driving transistor and a node for supplying a gate initialization voltage;

a setting transistor configured to be controlled by a fourth scan signal and disposed between a node for supplying a setting voltage and the driving transistor; and an auxiliary capacitor connected between the driving transistor and a node for supplying the low-potential base voltage.

16. The display device according to claim 15, wherein the second scan signal is a same signal in different phases with the fourth scan signal.

* * * * *